(12) United States Patent
Hu

(10) Patent No.: US 10,037,946 B2
(45) Date of Patent: Jul. 31, 2018

(54) PACKAGE STRUCTURE HAVING EMBEDDED BONDING FILM AND MANUFACTURING METHOD THEREOF

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 15/796,856

(22) Filed: Oct. 30, 2017

(65) Prior Publication Data

US 2018/0053723 A1    Feb. 22, 2018

Related U.S. Application Data

(63) Continuation-in-part of application No. 15/016,336, filed on Feb. 5, 2016, now Pat. No. 9,806,044.

(51) Int. Cl.
| | |
|---|---|
| H01L 23/48 | (2006.01) |
| H01L 23/52 | (2006.01) |
| H01L 29/40 | (2006.01) |
| H01L 23/538 | (2006.01) |
| H01L 23/00 | (2006.01) |
| H01L 25/065 | (2006.01) |
| H01L 25/18 | (2006.01) |
| H01L 21/48 | (2006.01) |
| H01L 25/00 | (2006.01) |

(52) U.S. Cl.
CPC ........ *H01L 23/5386* (2013.01); *H01L 21/486* (2013.01); *H01L 21/4853* (2013.01); *H01L 21/4857* (2013.01); *H01L 23/5381* (2013.01); *H01L 23/5383* (2013.01); *H01L 23/5384* (2013.01); *H01L 24/16* (2013.01); *H01L 24/17* (2013.01); *H01L 25/0655* (2013.01); *H01L 25/18* (2013.01); *H01L 25/50* (2013.01); *H01L 2224/16227* (2013.01); *H01L 2224/1703* (2013.01); *H01L 2924/1432* (2013.01); *H01L 2924/1434* (2013.01)

(58) Field of Classification Search
None
See application file for complete search history.

(56) References Cited

U.S. PATENT DOCUMENTS

| | | |
|---|---|---|
| 8,946,900 B2 | 2/2015 | Qian et al. |
| 9,543,249 B1 | 1/2017 | Hu |
| 2005/0205975 A1 | 9/2005 | Kang et al. |
| 2011/0102657 A1 | 5/2011 | Takahashi et al. |
| 2011/0161583 A1 | 6/2011 | Youn |

(Continued)

*Primary Examiner* — Thien F Tran
(74) *Attorney, Agent, or Firm* — JCIPRNET

(57) ABSTRACT

A package structure having an embedded bonding film including a redistribution substrate, a bonding film and a core is provided. The redistribution substrate has a top side and a bottom side opposite to the top side. The bonding film disposed at the top side and embedded in the redistribution substrate includes at least one bonding area and a metal circuit is disposed within the bonding area. The bonding area includes an outer top metal pad electrically coupled to an outer end of the metal circuit and an inner top metal pad on a top surface of the bonding film within the bonding area and electrically coupled to an inner end of the metal circuit. The core disposed at the bottom side of the redistribution substrate and electrically coupled to the redistribution substrate. A Young's modulus of the core is greater than a Young's modulus of the redistribution substrate.

14 Claims, 20 Drawing Sheets

(56) References Cited

U.S. PATENT DOCUMENTS

| | | | |
|---|---|---|---|
| 2012/0161331 A1* | 6/2012 | Gonzalez | H01L 23/5389 257/774 |
| 2013/0083582 A1 | 4/2013 | Crisp et al. | |
| 2015/0216053 A1 | 7/2015 | Sauer | |
| 2017/0229409 A1* | 8/2017 | Hu | H01L 24/08 |
| 2018/0005968 A1* | 1/2018 | Hu | H01L 25/0655 |

* cited by examiner

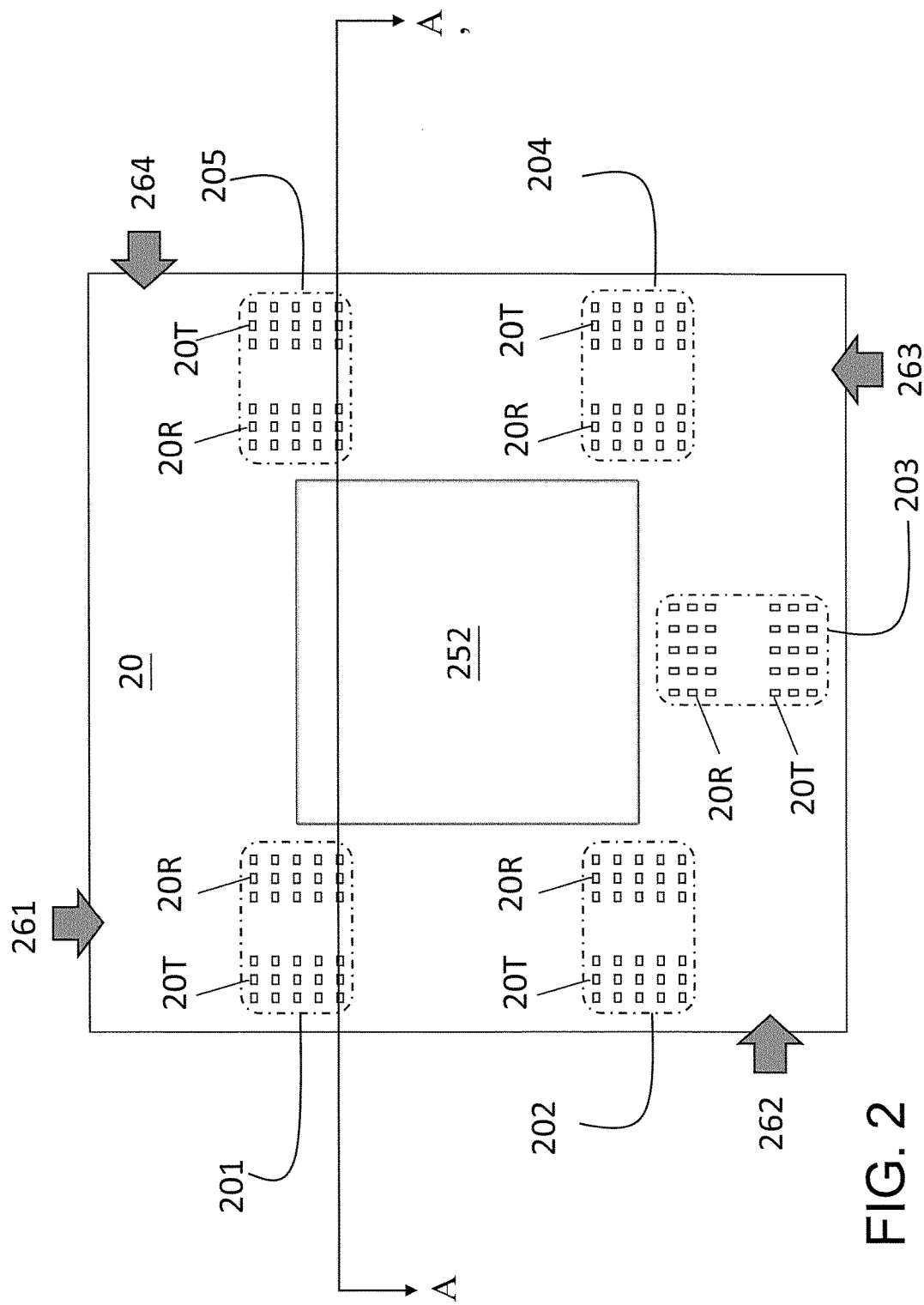

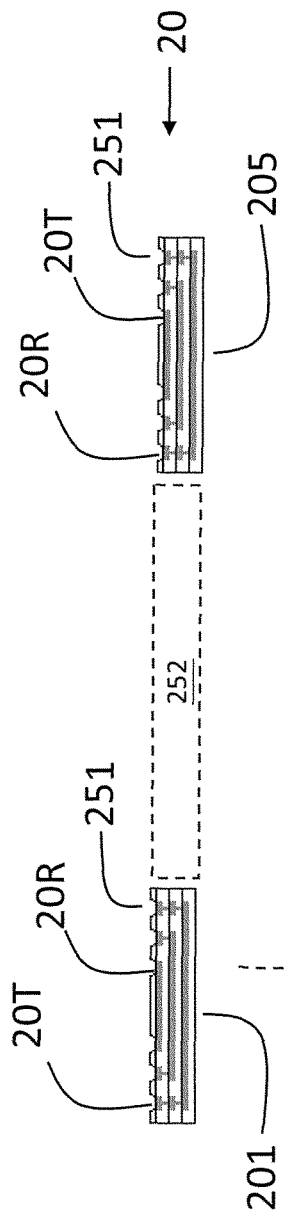
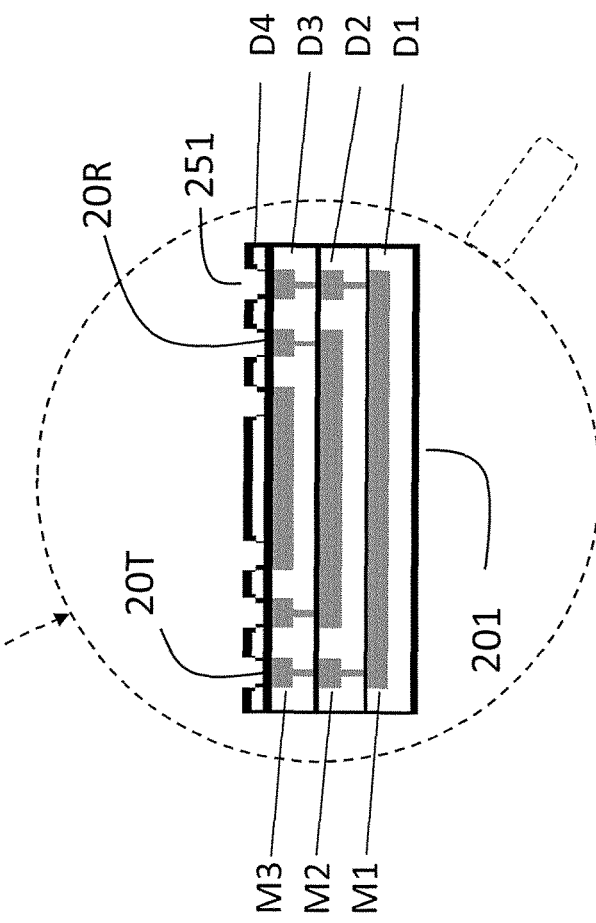
FIG. 3A
FIG. 3B

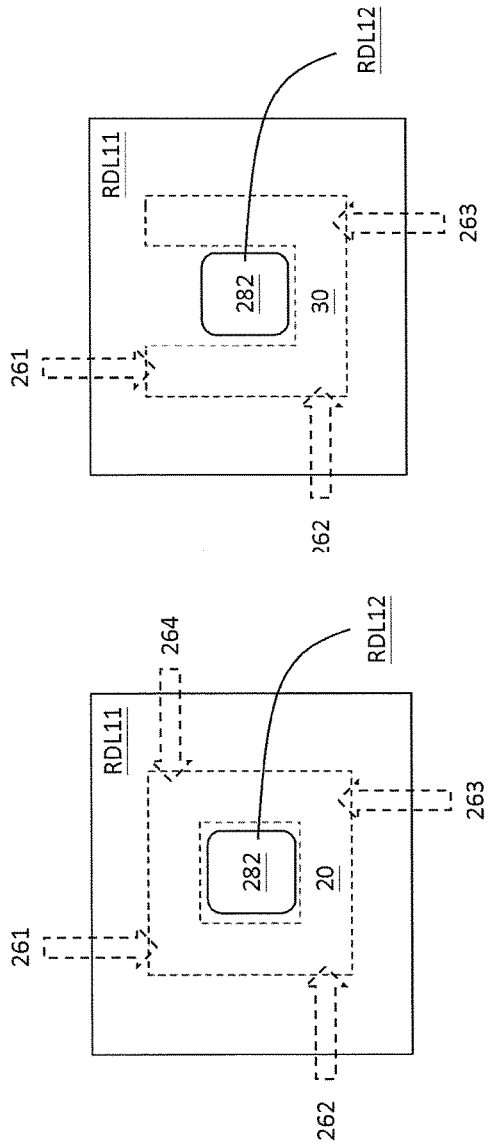
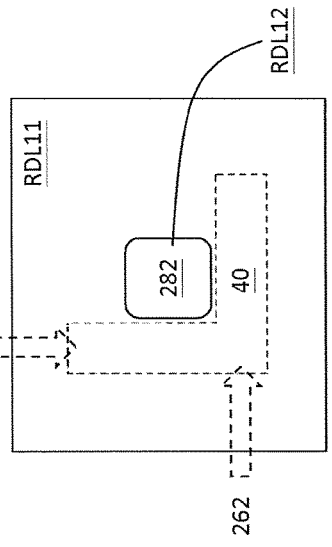
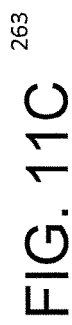
FIG. 11A
FIG. 11B
FIG. 11C

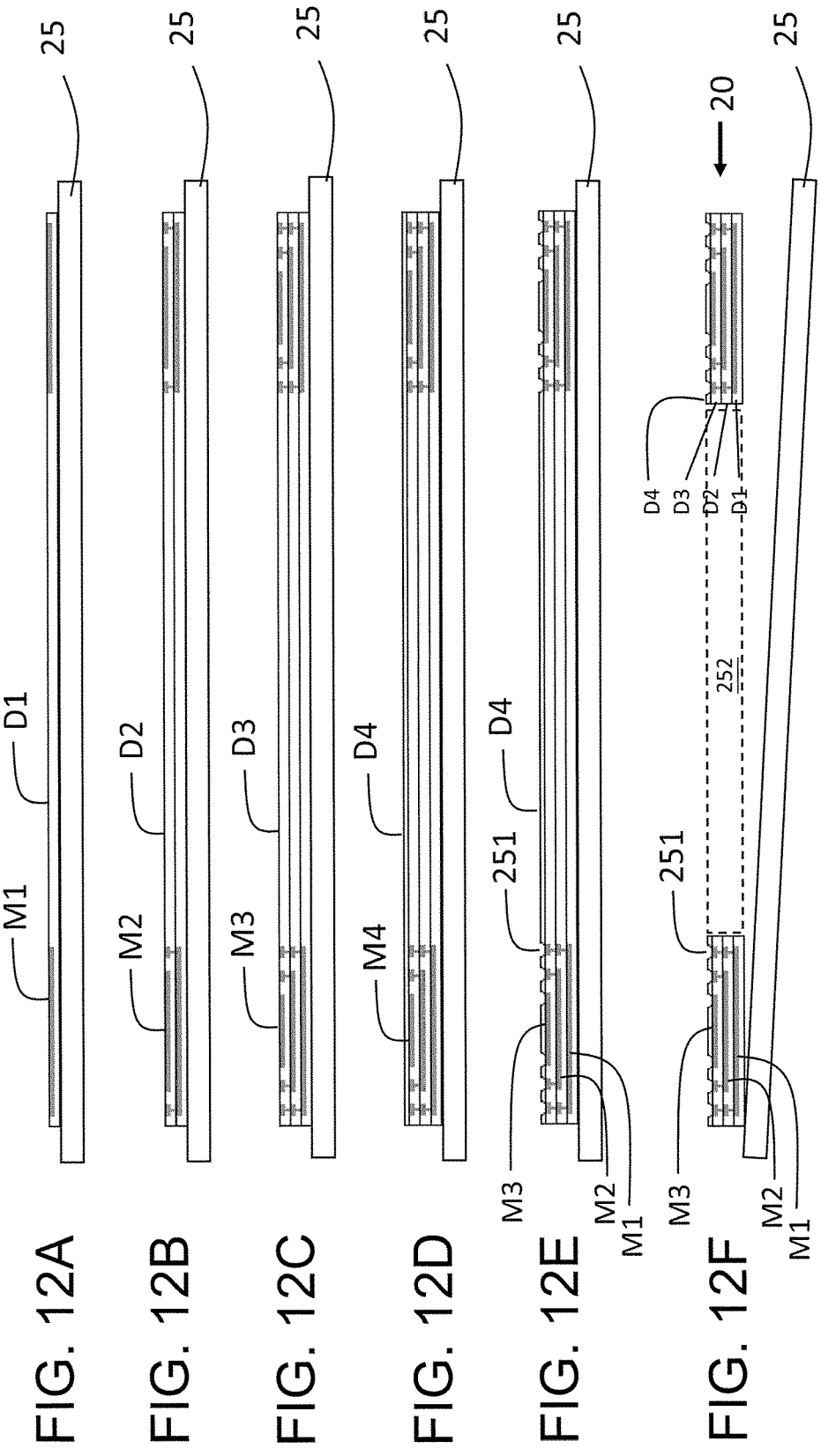

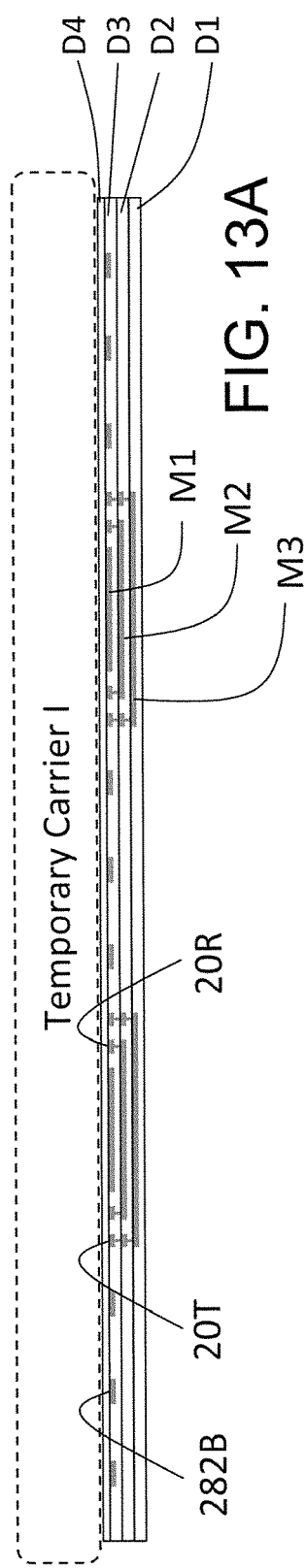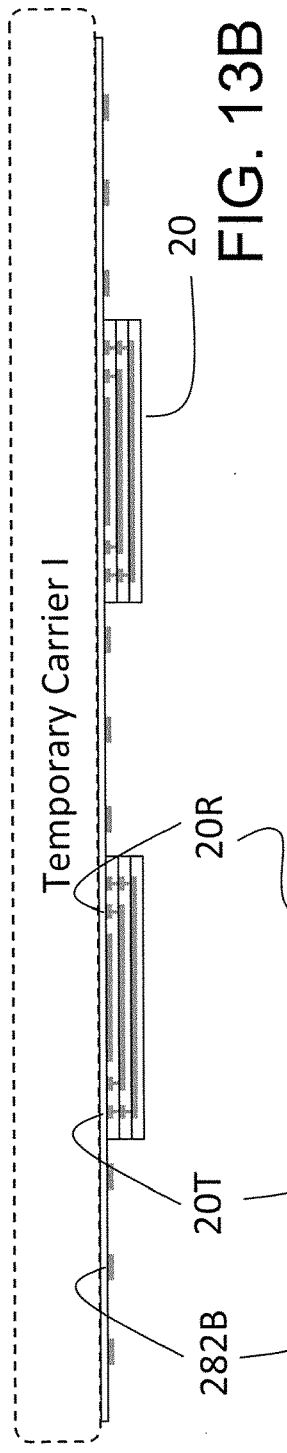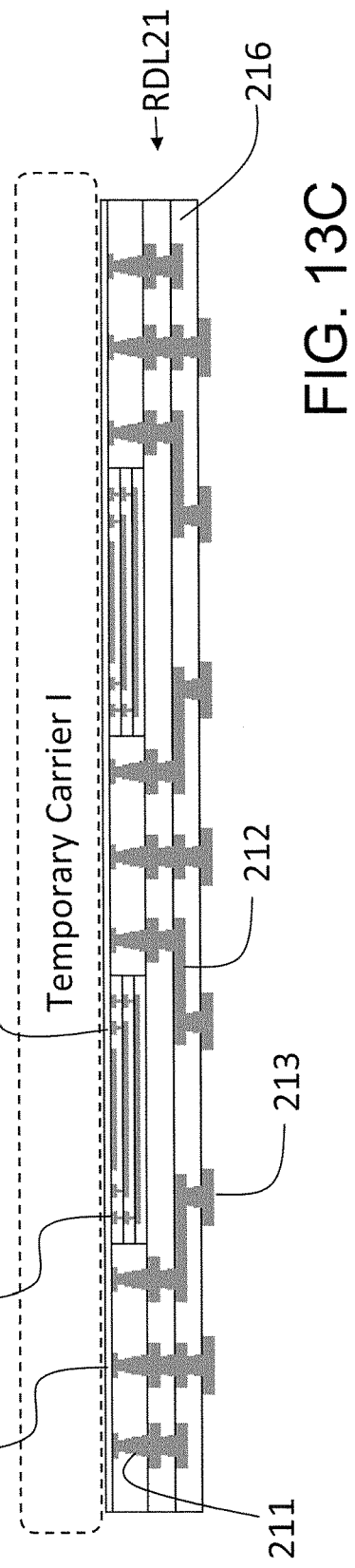

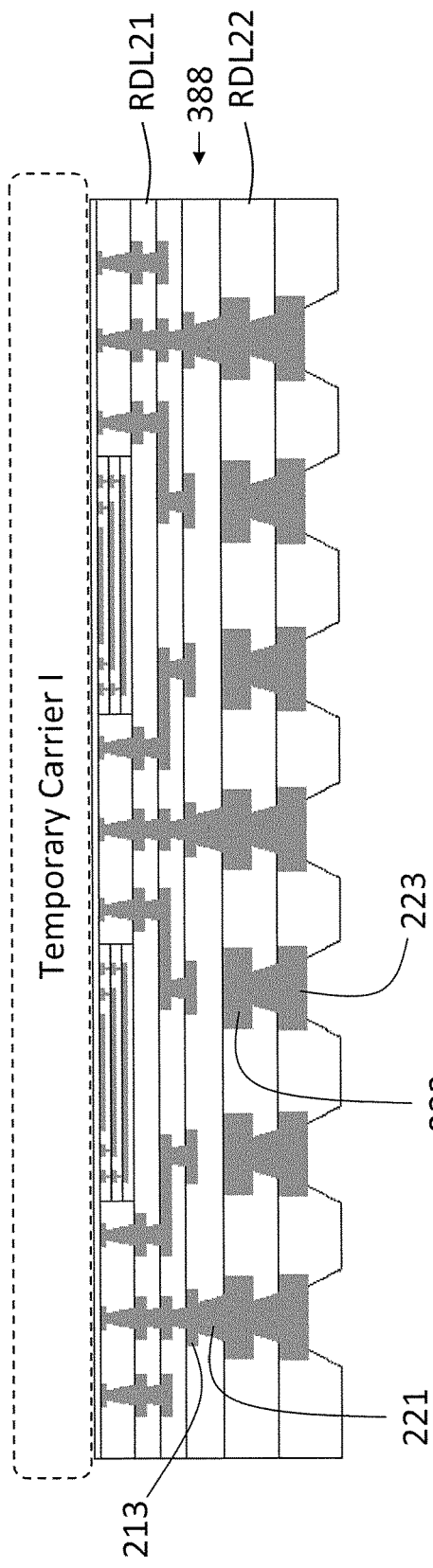
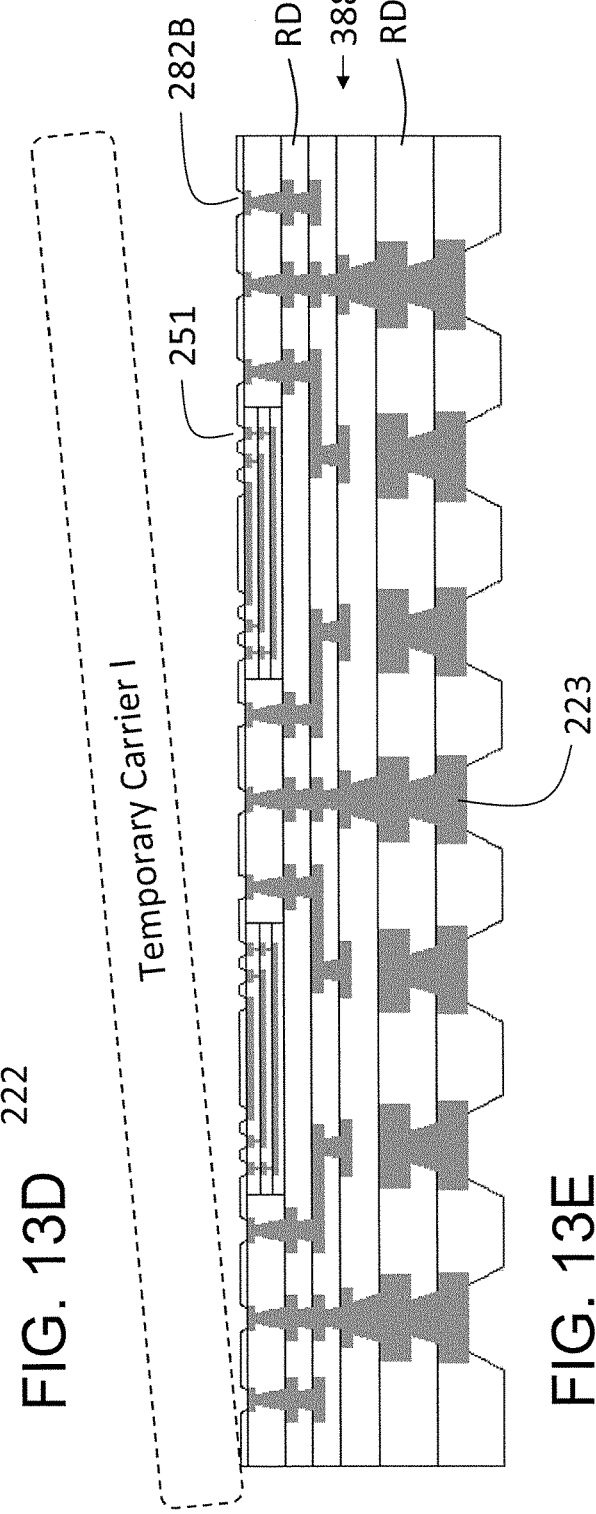

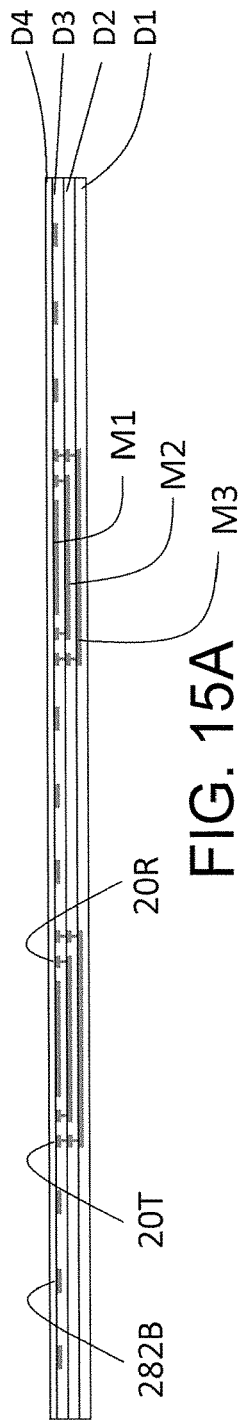
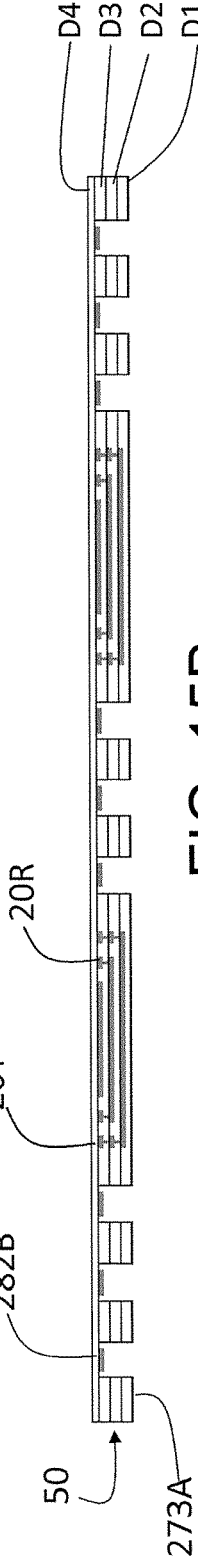
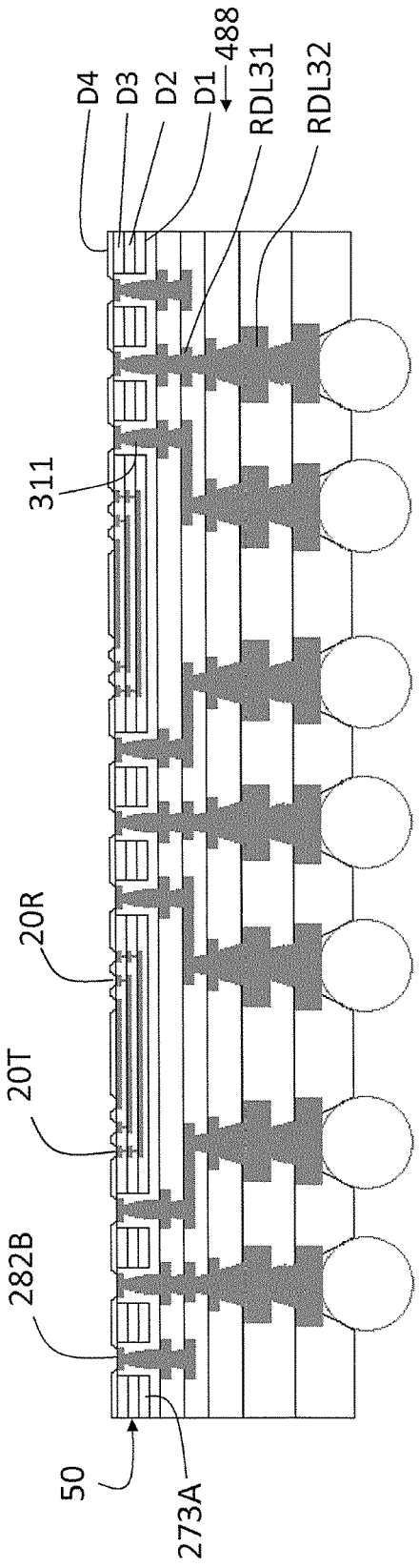

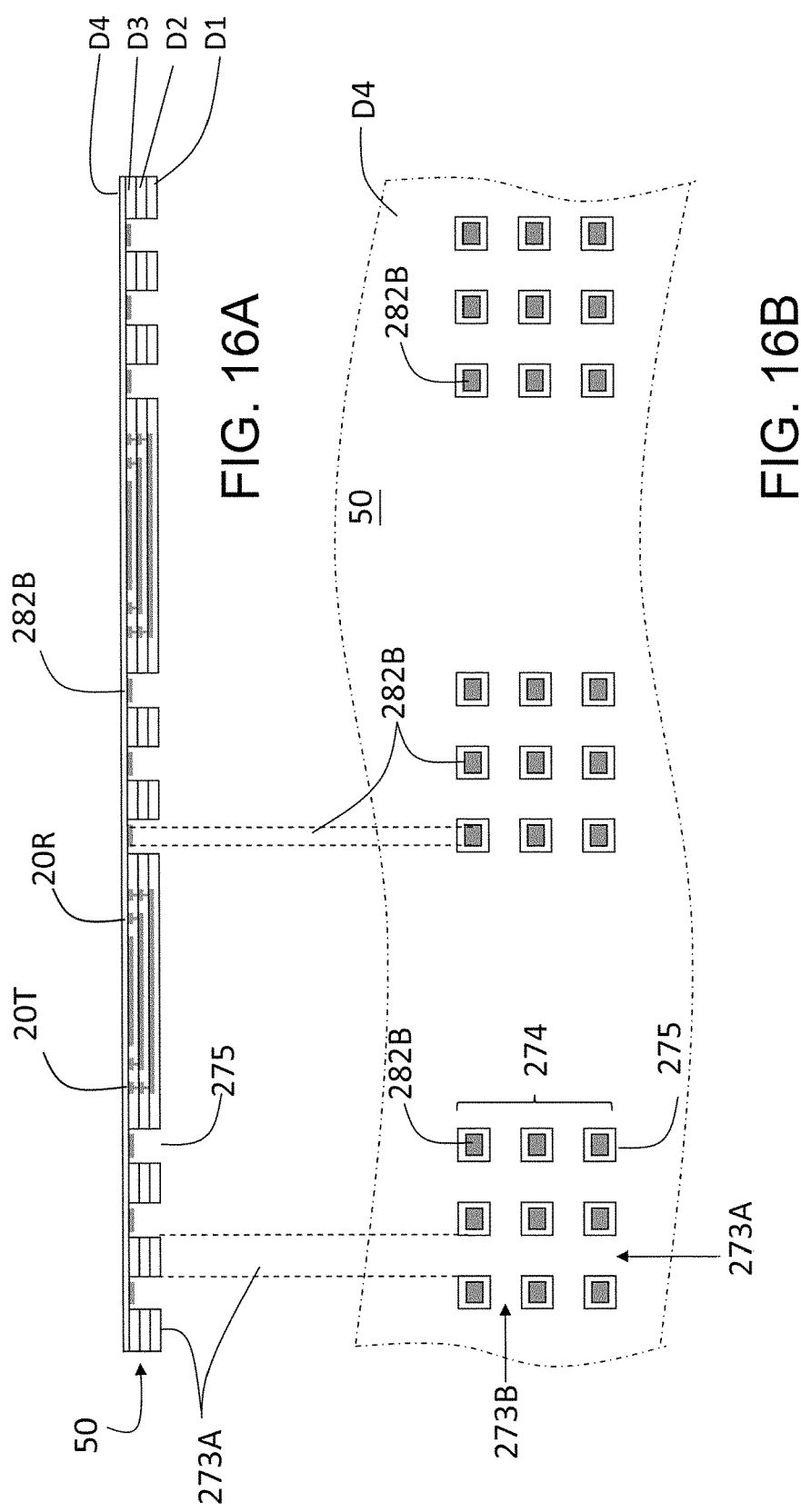

US 10,037,946 B2

PACKAGE STRUCTURE HAVING EMBEDDED BONDING FILM AND MANUFACTURING METHOD THEREOF

CROSS-REFERENCE TO RELATED APPLICATIONS

This application is a continuation-in-part application of and claims the priority benefit of U.S. application Ser. No. 15/016,336, filed on Feb. 5, 2016, now allowed. The entirety of the above-mentioned patent application is hereby incorporated by reference herein and made a part of this specification.

BACKGROUND

Technical Field

The present invention relates to a package structure, especially relates to a package structure having embedded bonding film.

Description of Related Art

FIG. 1 shows a prior art.

FIG. 1 shows that a first chip 11 and a second chip 12 are configured on a top side of an interposer 111. The interposer 111 is configured on a top side of a package substrate 112. The package substrate 112 is configured on a system board 113. For signal communication between the first chip 11 and the second chip 12, a long path needs to go as indicated by the dash line 15. Referring to FIG. 1, the communication path from chip 11 to chip 12 goes from the circuitry of the interposer 111, package substrate 112, system board 113, back to the package substrate 112, the interposer 111, and then reaches chip 12.

The disadvantage for the prior art is that the longer the path it goes, the weaker the signal is received. For a long time, a shorter circuitry for signal communication between neighboring chips is pursued.

BRIEF DESCRIPTION OF THE DRAWINGS

FIG. 2 shows a first embodiment according to the present invention.

FIGS. 3A~3B show a section view of FIG. 2 according to the present invention.

FIGS. 11A~11C show a top view for the three embodiments according to the present invention.

FIGS. 12A~12F show a fabrication process for making a bonding film according to the present invention.

FIGS. 13A~13F show a fabrication process for making a first embedded bonding film according to the present invention.

FIGS. 15A~15C show a fabrication process for making a second embedded bonding film according to the present invention.

FIGS. 16A~16B show a bottom view of FIG. 15B.

DETAILED DESCRIPTION OF THE INVENTION

Figure 1:
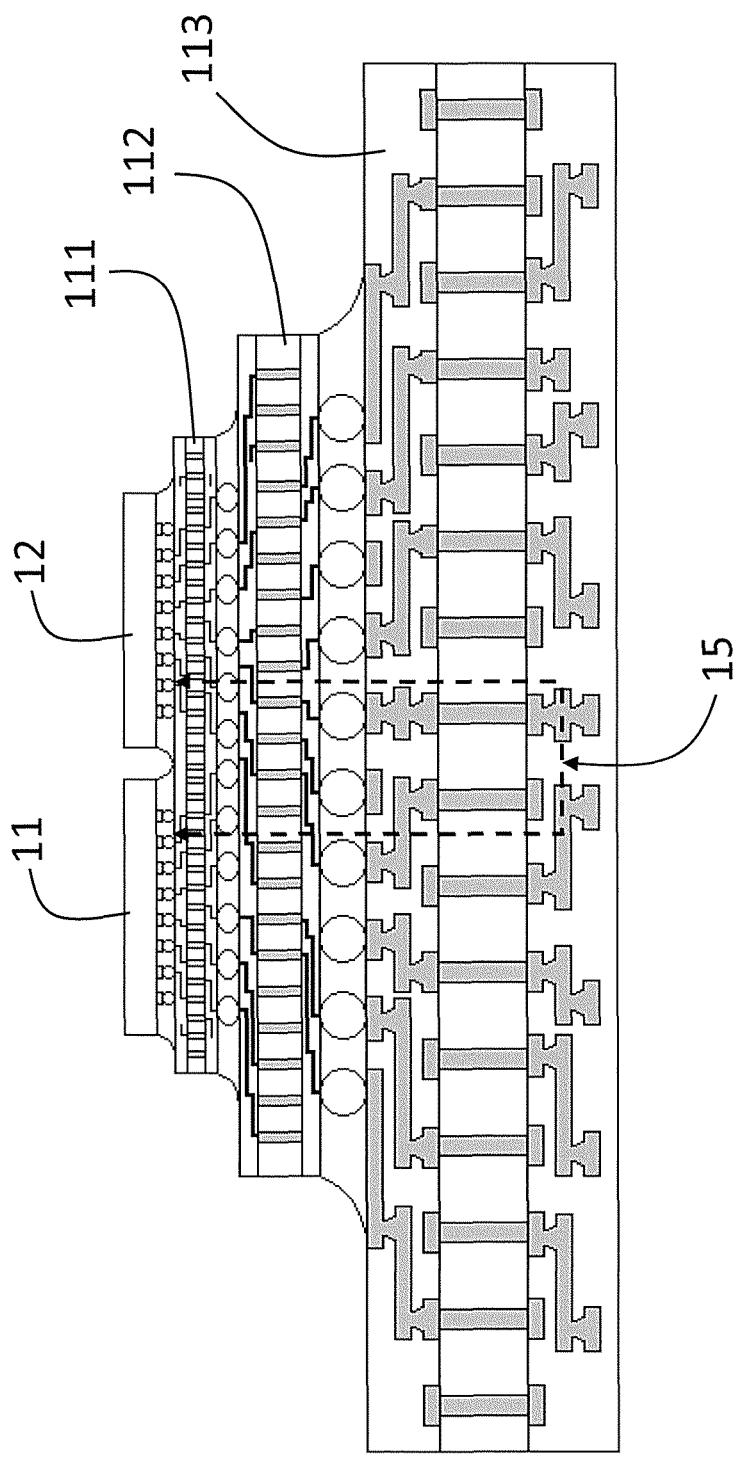
FIG. 1 shows a prior art.

A bonding film having at least two bonding areas therein for signal communication between neighboring chips is disclosed. A first bonding area located in a first branch of the branches of the bonding film, a second bonding area located in a second branch of the branches of the bonding film, a central chip (e.g. CPU) is able to electrically couple to peripheral chips (e.g. memory chip) through a circuitry of the bonding film. The communication circuitry of the bonding film according to the present invention has a shorter path than that of the traditional communication path in a multi-chip package.

FIG. 2 shows a first embodiment according to the present invention.

FIG. 2 shows that a bonding film 20 comprises a left longitudinal branch 261, a lower latitudinal branch 262, a right longitudinal branch 263, and an upper latitudinal branch 264. The left longitudinal branch 261 has a lower end connected with a left end of the lower latitudinal branch 262. The right longitudinal branch 263 has a lower end connected with a right end of the lower latitudinal branch 262. The upper latitudinal branch 264 has a left end connected with an upper end of the left longitudinal branch 261, and has a right end connected with an upper end of the right longitudinal branch 263.

A first bonding area 201 and a second bonding area 202 are configured in the left longitudinal branch 261. A third bonding area 203 is configured in the lower latitudinal branch 262. A fourth bonding area 204 and a fifth bonding area 205 are configured in the right longitudinal branch 263. A plurality of outer top metal pads 20T and a plurality of inner top metal pads 20R are exposed on a top surface of the bonding film 20 within each of the bonding areas 201, 202, 203, 204, 205.

A first and a second metal circuitry (FIG. 3A) are embedded in the left longitudinal branch 261 within the first and second bonding area 201, 202 respectively. A third metal circuitry (not shown) is embedded in the lower latitudinal branch 262 within the third bonding area 203. A fourth and fifth metal circuitry (not shown) are embedded in the right longitudinal branch 263 within the fourth and fifth bonding area (FIG. 3A) 204, 205 respectively.

FIGS. 3A~3B show a section view of FIG. 2 according to the present invention.

FIG. 3A shows a section view according to line AA' of FIG. 2. A plurality of first metal circuits M1, M2, M3 are embedded in the left longitudinal branch 261 within the first bonding area 201; each of the first metal circuits M1, M2, M3 has a left end electrically coupled to one of the outer top metal pads 20T, and each of the first metal circuits has a right end electrically coupled to one of the inner top metal pads 20R. A plurality of second, third, and fourth metal circuits are not shown in FIG. 3A. A plurality of fifth metal circuits M1, M2, M3, are embedded in the right longitudinal branch 263 within the fifth bonding area 205; each of the fifth metal circuits M1, M2, M3 has a left end electrically coupled to one of the outer top metal pads 20T, and each of the fifth metal circuits has a right end electrically coupled to one of the inner top metal pads 20R. A central opening 252 is configured in a central area of the bonding film 20. A plurality of top openings 251 are formed in the dielectric layer D4 to expose the outer top metal pads 20T and the inner top metal pads 20R.

FIG. 3B shows an enlarged view of the first bonding area 201 of the FIG. 3A. A plurality of dielectric layers D1, D2, D3, D4 and a plurality of metal circuits M1, M2, M3 are formed alternatively and sequentially to form the bonding film 20 according to semiconductor process. Four dielectric layers D1, D2, D3, D4 and three metal circuits M1, M2, M3 are shown as an example. More or less layers can be designed in according to a specific design choice. A plurality of top openings 251 are formed in the dielectric layer D4 to expose the outer top metal pads 20T and the inner top metal pads 20R. Both the outer top metal pads 20T and the inner top metal pads 20R are small pads.

Figure 4:
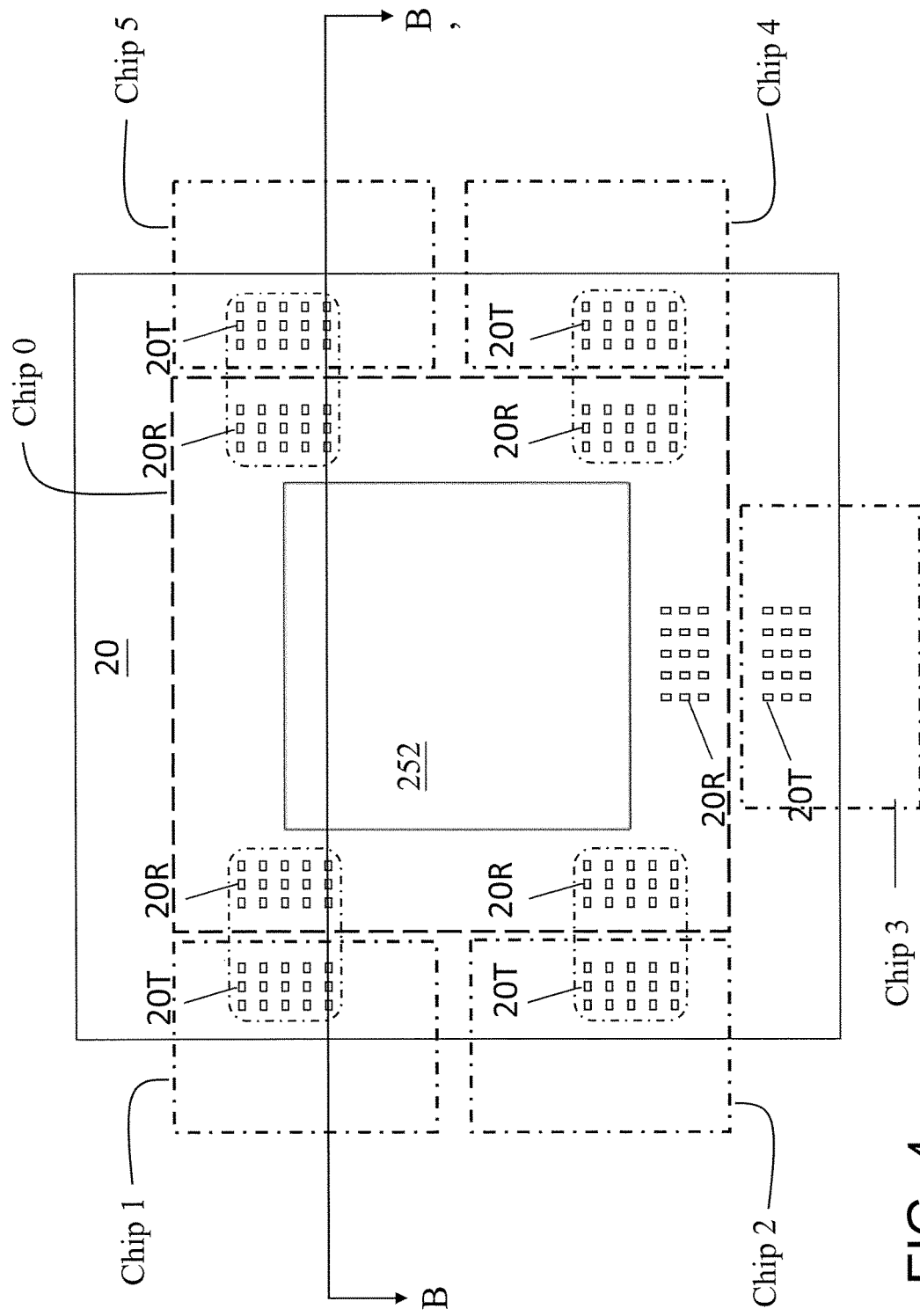
FIG. 4 shows an application of the first embodiment according to the present invention.

FIG. 4 shows an application of the first embodiment according to the present invention.

FIG. 4 shows that a central chip 0 is configured on a top center of the bonding film 20. A chip 1 and a chip 2 are configured on a left side of the central chip 0, a chip 3 is configured on a lower side of the central chip 0; chip 4 and chip 5 are configured on a right side of the central chip 0.

Figure 5:
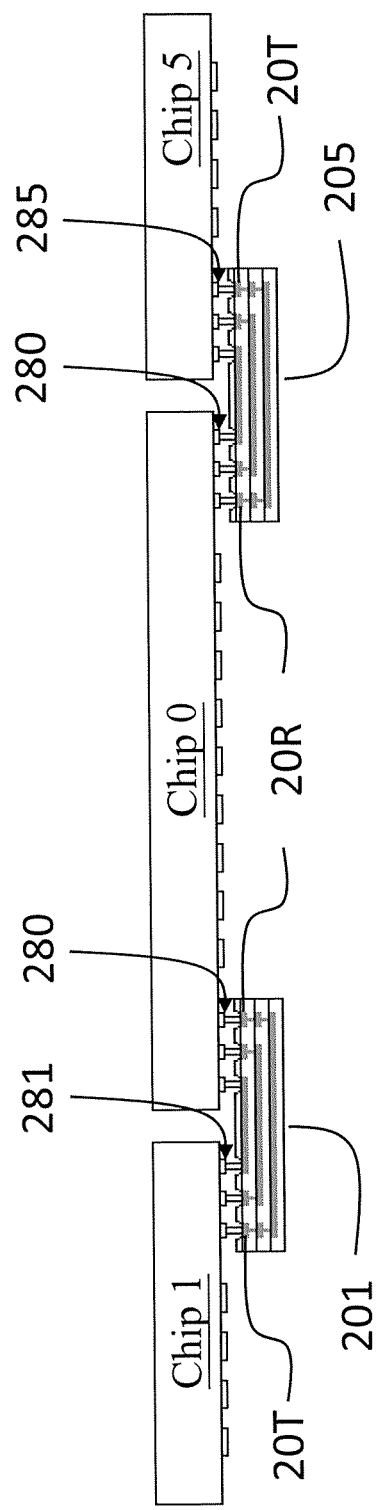
FIG. 5 shows a section view according to line BB' of FIG. 4.

FIG. 5 shows a section view according to line BB' of FIG. 4.

FIG. 5 shows that the central chip 0 has a plurality of bonding elements 280 (also referred to the central bonding element) configured on bottom side and adapted to electrically couple to corresponding inner top metal pads 20R. Each of the chip 1 and chip 2 has a plurality of bonding elements 281 (also referred to the peripheral bonding element) configured on bottom side and adapted to electrically couple to corresponding outer top metal pads 20T. Similarly, chip 3, chip 4 and chip 5 (not shown in FIG. 5), each has bonding elements on bottom side to electrically couple to corresponding outer top metal pads 20T.

Figure 6:
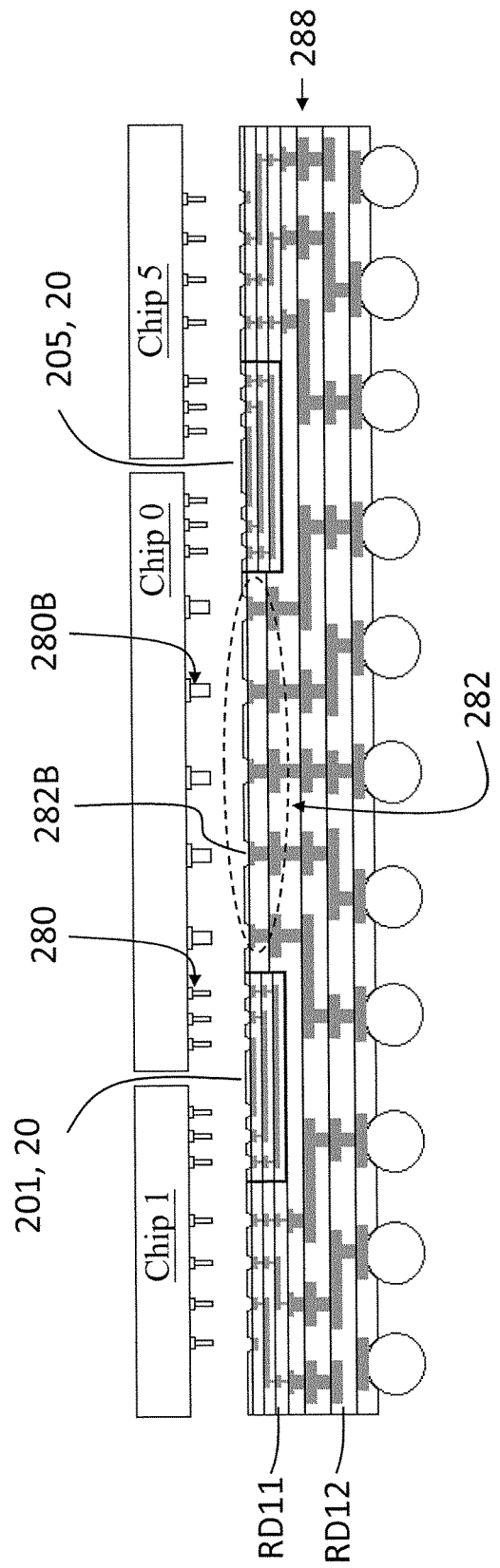
FIG. 6 shows a first embedded bonding film according to the present invention.

FIG. 6 shows a first embedded bonding film according to the present invention.

FIG. 6 shows that a bonding film 20 is embedded in a redistribution substrate 288 which comprises a top redistribution layer RDL11 and a bottom redistribution layer RDL12. The top redistribution layer RDL11 wraps around an outer periphery of the bonding film 20. The bottom redistribution layer RDL12 is configured on a bottom side of the top redistribution layer RDL11.

The top redistribution layer RDL11 is fabricated according to semiconductor process with a circuit design rule similar to that of the bonding film 20. The bottom redistribution layer RDL12 is fabricated according to printed circuit board (PCB) lamination process. The bottom redistribution layer RDL 12 has metal circuit at least ten times thicker than that of the top redistribution layer RDL11.

The bottom redistribution layer RDL12 has a central portion 282 configured within the central opening 252 (FIG. 4) of the bonding film 20. The central portion 282 has a plurality of large metal pads 282B exposed on top side and aligned with the bonding elements 280B in central bottom of the central chip 0 so that the thick bonding elements 280B are able to electrically couple to corresponding large metal pads 282B of the central portion 282. Each of the large metal pads 282B has a surface area at least two times than that of the small pads 20T, 20R. The thick bonding elements 280B can be one of power pins, and the large metal pad 282B can be one of power pads.

Referring to the central chip 0, a second plurality of thick bonding elements 280B (power pins) are configured on a central bottom of the central chip 0. Each of the thick bonding elements 280B (also referred to the central thick bonding element) is thicker than each of the first plurality of bonding elements 280 (signal pins) configured on a bottom periphery of the central chip 0. The thick bonding elements 280B are designed for large current connection such as power connection elements.

Figure 7:
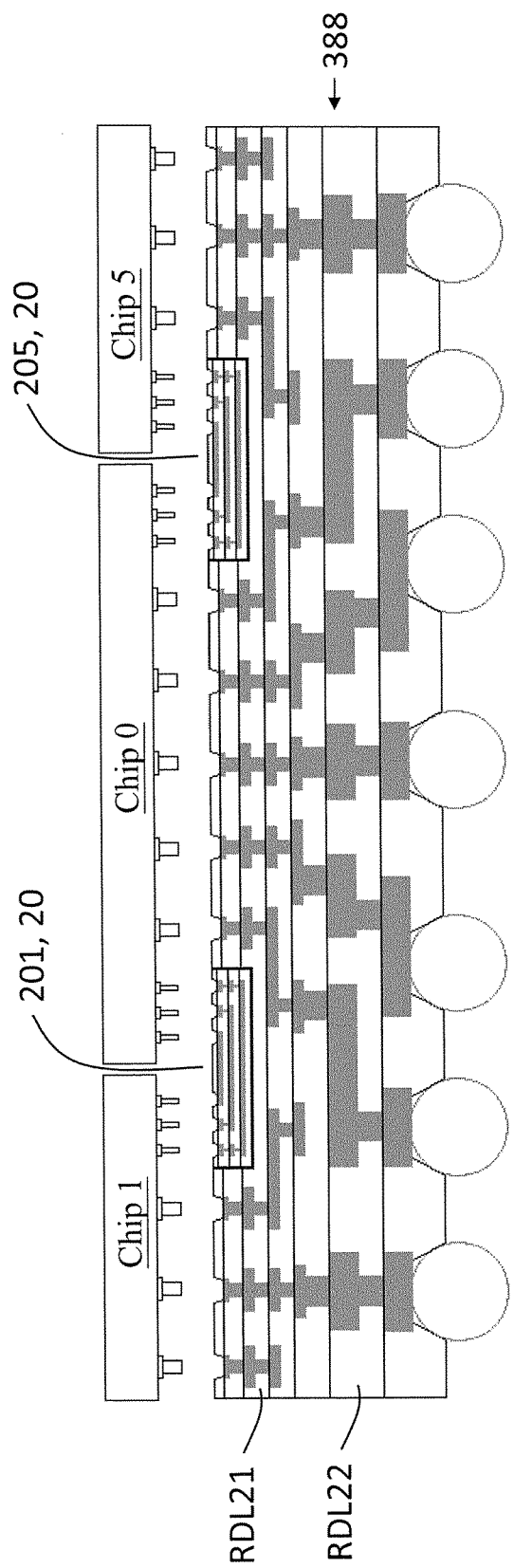
FIG. 7 shows a second embedded bonding film according to the present invention.

FIG. 7 shows a second embedded bonding film according to the present invention.

FIG. 7 shows the bonding film 20 is embedded in a redistribution substrate 388 which comprises a top redistribution layer RDL21 and a bottom redistribution layer RDL22. The top redistribution layer RDL21 is fabricated according to printed circuit board (PCB) lamination process. The top redistribution layer RDL21 has metal circuits with a thickness at least ten times thicker than that of the bonding film 20. The bottom redistribution layer RDL22 is fabricated according to printed circuit board (PCB) lamination process. The bottom redistribution layer RDL22 has metal circuits with a thickness at least ten times thicker than that of the top redistribution layer RDL21.

FIG. 7 shows that a thickness of each circuit of the top redistribution layer RDL21 is at least ten times thicker than that of the bonding film 20, and a thickness of each circuit of the bottom redistribution layer RDL22 is at least ten times thicker than that of the top redistribution layer RDL21. The figures are not drawn to scale. Referring to the central chip 0 and the peripheral chips (e.g. 1, 5), each of the thick bonding elements 280B is thicker than each of the first plurality of bonding elements 280 (signal pins) configured on the bottom periphery of the central chip 0 which is similar with the embodiment shown in FIG. 6. The peripheral chips may include a plurality of peripheral thick bonding elements disposed aside the bonding elements 285 (shown in FIG. 5) and may be further connected to the metal pads of top redistribution layer RDL 21 (shown in FIG. 17A). Each of the peripheral thick bonding elements is thicker than each of the bonding elements 285.

Figure 8:
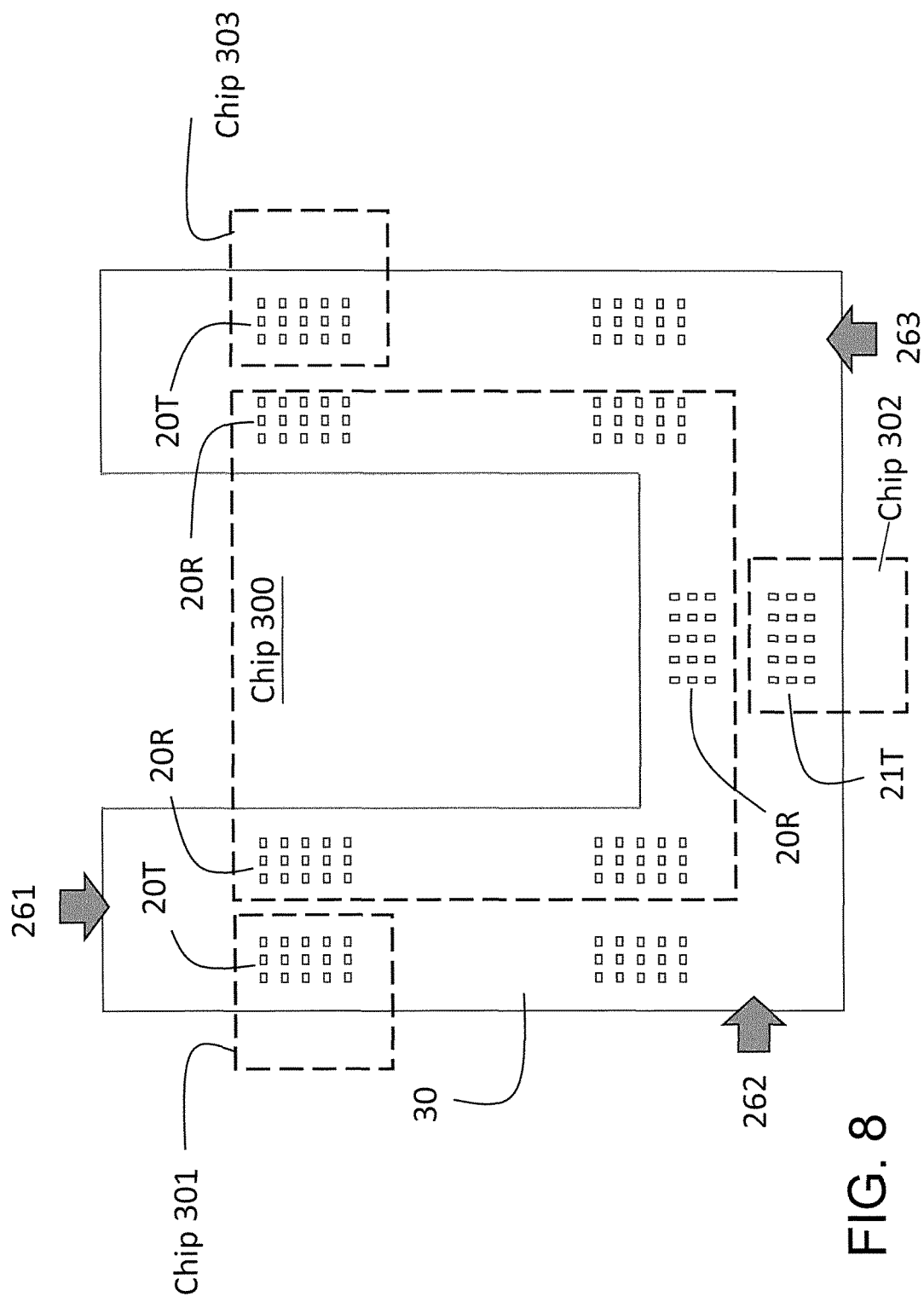
FIG. 8 shows a second embodiment according to the present invention.

FIG. 8 shows a second embodiment according to the present invention.

FIG. 8 shows that a U shaped bonding film 30 is formed with a left longitudinal branch 261, a lower latitudinal branch 262, and a right longitudinal branch 263. The U shaped bonding film 30 has a plurality of outer bonding pads 20T and a plurality of inner bonding pads 20R exposed on top side of the U shaped bonding film 30. The three branches 261, 262, 263 forms a U shaped bonding film 30. The U shaped bonding film 30 provides left side, lower side, and right side accommodation for at least three chips 301, 302, 303 each configured on one of the three sides, so that a central chip 300 is able to electrically couple to the peripheral chips 301, 302, 303 through the outer bond pads 20T and the inner bond pads 20R of the U shaped bonding film 30.

Figure 9:
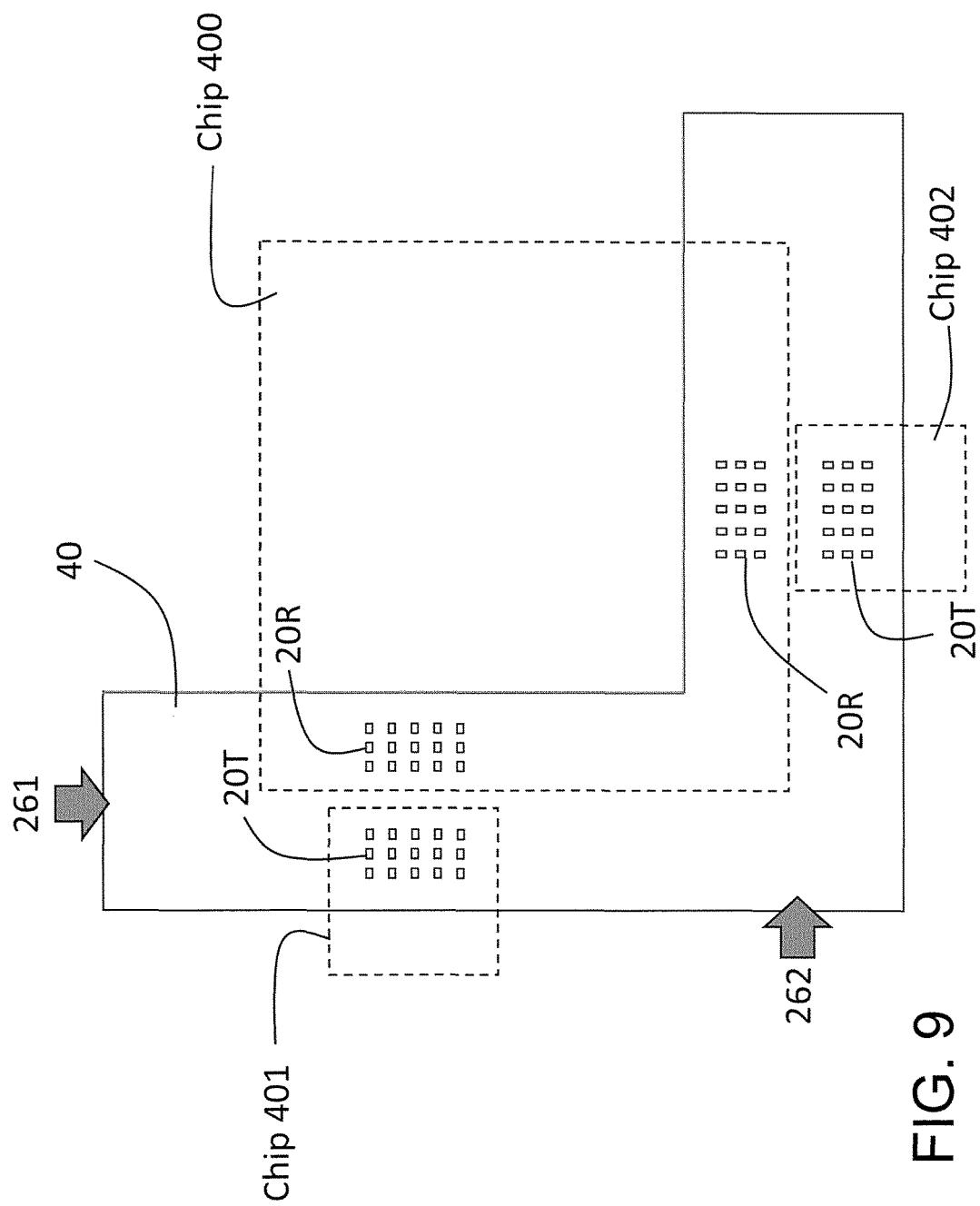
FIG. 9 shows a third embodiment according to the present invention.

FIG. 9 shows a third embodiment according to the present invention.

FIG. 9 shows that an L shaped bonding film 40 is formed with a left longitudinal branch 261, and a lower latitudinal branch 262. The L shaped bonding film 40 has a plurality of outer bonding pads 20T and a plurality of inner bonding pads 20R exposed on top side of the L shaped bonding film 40. The two branches 261, 262, forms an L shaped bonding film 40. The L shaped bonding film 40 provides left side, and lower side accommodation for chips 401, 402, each on one side of the two sides, so that a central chip 400 is able to electrically couple to the peripheral chips 401, 402 through the inner bonding pads 20R and the outer bonding pads 20T of the L shaped bonding film 40.

Figure 10:
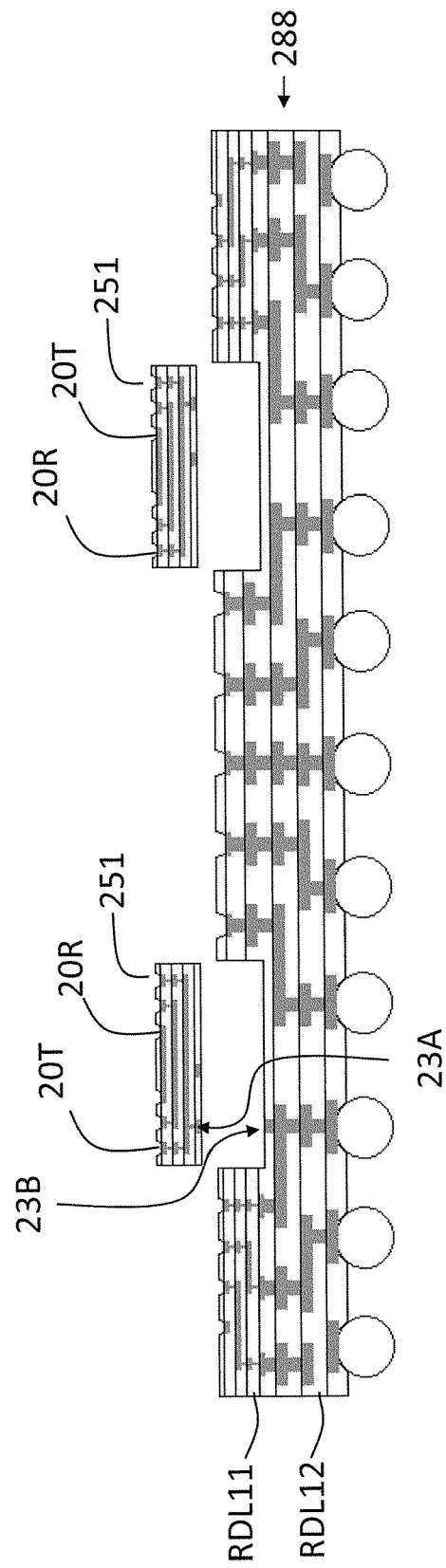
FIG. 10 shows a fourth embodiment according to the present invention.

FIG. 10 shows a fourth embodiment according to the present invention.

FIG. 10 shows that the bonding film 20 further comprises bottom contact 23A which is able to electrically couple to a top metal contact 23B of the redistribution circuitry of the redistribution layer RDL12 on bottom when the bonding film 20 is embedded in the redistribution substrate.

FIGS. 11A~11C show a top view for the three embodiments according to the present invention.

FIG. 11A shows that the central portion 282 of the redistribution layer RDL12 is configured in the central opening of the bonding film 20. The top redistribution layer RDL11 wraps around an outer periphery of the bonding film 20.

FIG. 11B shows that the central portion 282 of the redistribution layer RDL12 is configured in the central opening of the U shaped bonding film 30. The top redistribution layer RDL11 wraps around an outer periphery of the U shaped bonding film 30.

FIG. 11C shows that the central portion 282 of the redistribution layer RDL12 is configured in the central opening of the L shaped bonding film 40. The top redistribution layer RDL11 wraps around an outer periphery of the L shaped bonding film 40.

FIGS. 12A~12F show a fabrication process for making a bonding film according to the present invention.

A fabrication process for making a bonding film, in a section view, comprises:

FIG. 12A shows: preparing a temporary carrier 25; and forming a first dielectric layer D1 and a first metal circuitry M1 on top surface of the temporary carrier 25;

FIG. 12B shows: forming a second dielectric layer D2 and a second metal circuitry M2 on a top surface of the first dielectric layer D1 and the first metal circuitry M1;

FIG. 12C shows: forming a third dielectric layer D3 and a third metal circuitry M3 on a top surface of the second dielectric layer D2 and the second metal circuitry M2;

FIG. 12D shows: forming a fourth dielectric layer D4 and a fourth metal circuitry M4 on a top surface of the third dielectric layer D3 and the third metal circuitry M3;

FIG. 12E shows: etching to form opening 251 in the dielectric layer D4 to expose a plurality of outer top metal pads 20T on top and to expose a plurality of inner top metal pads 20R on top;

FIG. 12F shows: etching to form a bonding film 20, wherein the bonding film 20 has a left longitudinal branch 261, a lower latitudinal branch 262, a right longitudinal branch 263, and an upper latitudinal branch 264; wherein at least two bonding areas 201, (202, 203, 204) 205 are configured in the bonding film 20; wherein a first bonding area is configured in one of the two longitudinal branches 261, 263 and the other one is configured in one of the other three branches; and wherein each of the two bonding areas 201, (202, 203, 204) 205 has a plurality of outer top metal pads 20T exposed on a top surface of the bonding film 20, and a plurality of inner top metal pads 20R exposed on the top surface of the bonding film 20; each of the bonding area 201, (202, 203, 204) 205 has a plurality of metal circuits M1, M2, M3 embedded in the bonding film 20, and each of the metal circuits M1, M2, M3 has a left end electrically coupled to one of the outer top metal pads 20T, and each of the metal circuits M1, M2, M3 has a right end electrically coupled to one of the inner top metal pads 20R.

FIGS. 13A~13F show a fabrication process for making a first embedded bonding film according to the present invention.

For FIGS. 13A~13G, for easier understanding, the products or semi-products are kept in a normal position, i.e. chip side upwards, and therefore temporary carrier is configured on top side although it should be on a bottom side in actual process.

FIG. 13A shows: forming a plurality of dielectric layers D1~D4 and metal circuit layers M1, M2, M3 sequentially on bottom of a temporary carrier I through semiconductor process. The topmost metal circuit layer M1 includes a plurality of small pads 20T, 20R and a plurality of large metal pads 282B. A material for the dielectric layers D1~D4, D1~D4 for the semiconductor process comprises those typically used in semiconductor back end of line (BEOL) process includes but not limited to silicon dioxide ($SiO_2$), and silicon nitride ($Si_3N_4$), polyimide, Bisbenzocyclobutene (BCB), and Silicone.

FIG. 13B shows: etching selectively to leave large metal pads 282B and a structure of bonding film 20.

FIG. 13C shows: forming a first redistribution layer RDL21 through lamination process. RDL21 has a plurality of metal via 211, each metal via 211 is electrically coupled to a corresponding one of the large metal pads 282B. RDL21 has circuitry 212 and a plurality of bottom metal pads 213. Bonding film 20 is embedded in the first redistribution layer RDL21. A material for the dielectric layer 216 in lamination process comprises those common materials used in laminated substrate such as ABF, pre-pregs, polyimide, BCB, and silicone.

FIG. 13D shows: forming a second redistribution layer RDL22 on a bottom of the RDL21 through lamination process. RDL22 has a plurality of metal via 221, each metal via 221 is electrically coupled to a corresponding one of the metal pads 213. RDL22 has circuitry 222 and a plurality of bottom metal pads 223.

FIG. 13E shows: removing temporary carrier I and forming a plurality of top opening 251. Each top opening 251 exposes a corresponding one of the top metal pads 20T, 20R and large metal pads 282B.

Figure 13F:
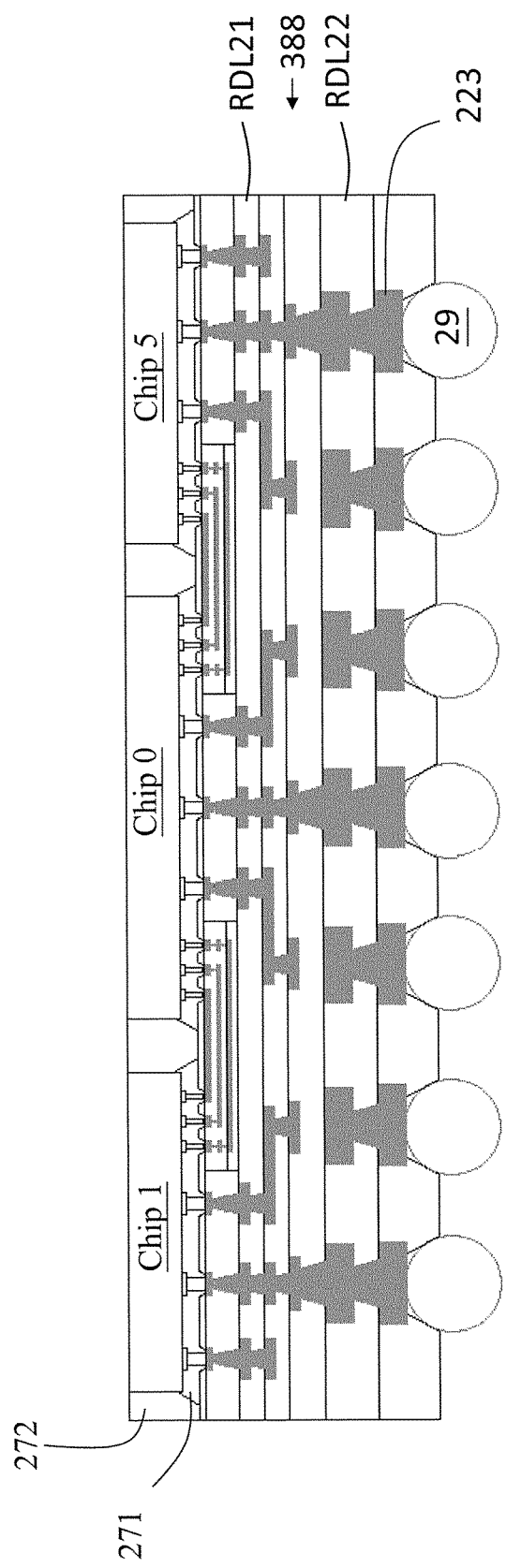

FIG. 13F shows: mounting chip 0, chip 1, and chip 5 on top of the substrate 388, and planting solder ball 29 on bottom of the substrate 388. Underfill 271 is filled in a gap between the chips and the substrate 388. Molding compound 272 is applied to encapsulate the chips.

Figure 14:
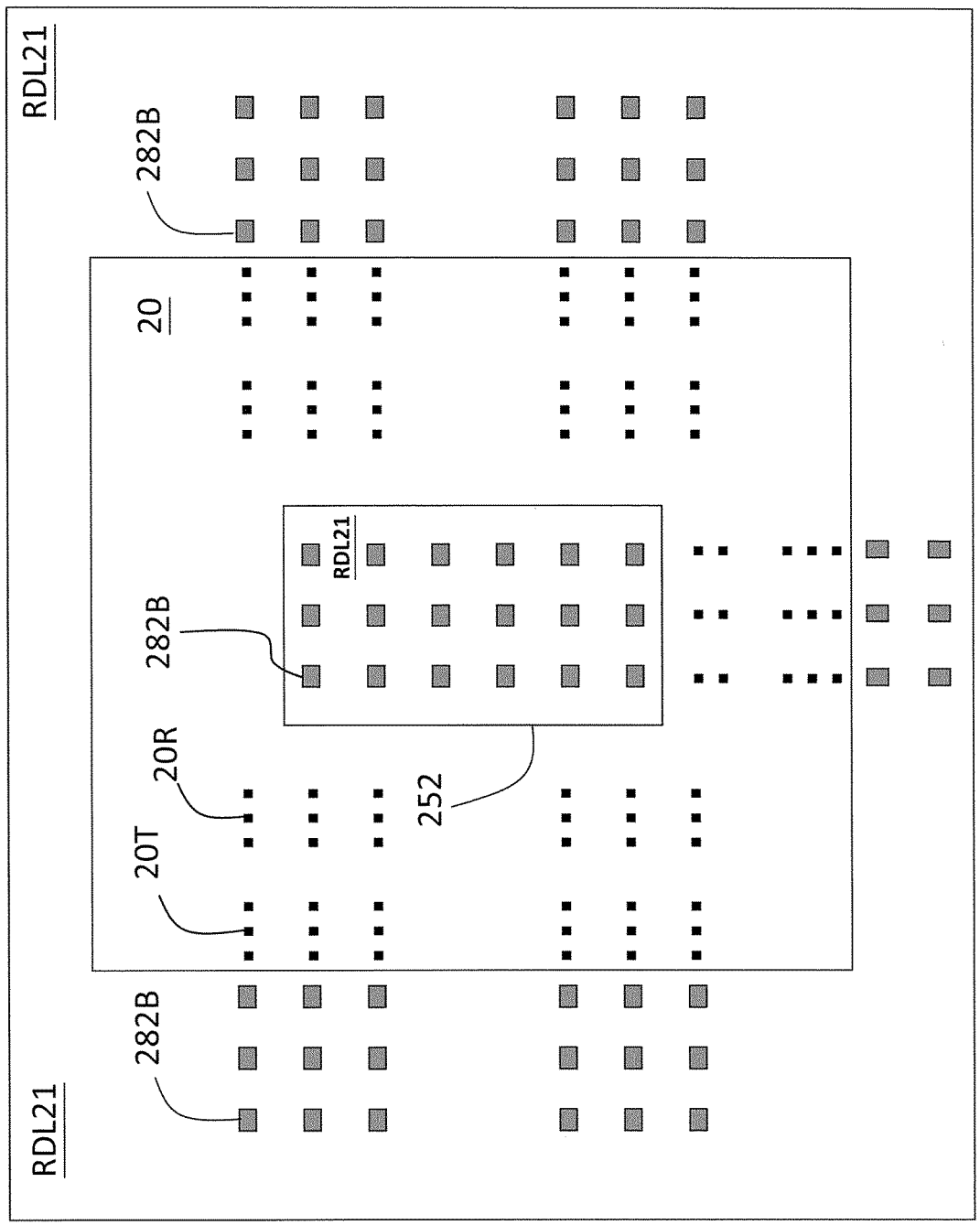
FIG. 14 shows a top view of an embedded bonding film according to the present invention.

FIG. 14 shows a top view of an embedded bonding film according to the present invention.

FIG. 14 shows a top view of a substrate in FIG. 13E or FIG. 13F. FIG. 14 shows a bonding film 20 is embedded in the first redistribution layer RDL21. The first redistribution layer RDL21 is coplanar with the bonding film 20 on top surface. A plurality of large metal pads 282B is configured on top surface of the RDL21. A first plurality of the large metal pads 282B are configured within the central opening 252 of the bonding film 20, and a second plurality of the large metal pads 282B are configured surrounding the bonding film 20.

FIGS. 15A~15C show a fabrication process for making a second embedded bonding film according to the present invention.

A ribbed bonding film 50 embedded in a substrate 488 is fabricated according the embodiment.

FIG. 15A shows: forming a plurality of dielectric layers D1~D4 and metal circuit layers M1, M2, M3 sequentially.

The topmost metal circuit layer M1 includes a plurality of small pads 20T, 20R and a plurality of large metal pads 282B.

FIG. 15B shows: etching selectively to leave large metal pads 282B and a plurality of dielectric ribs 273 to form a ribbed bonding film 50. The dielectric ribs 273 can be fabricated in a form of parallel (FIG. 16B) only or in a form of a mesh (FIG. 16B) to strengthen the stiffness of the bonding film 50.

FIG. 15C shows: forming a first redistribution layer RDL31 through lamination process. RDL31 has a plurality of metal via 311, each metal via 311 is electrically coupled to a corresponding one of the large metal pads 282B. A second redistribution layer RDL32 is formed on a bottom of the RDL31. The top bonding film 50 is buried in the substrate 488. The substrate 488 comprises the first redistribution RDL31 and the second redistribution RDL32.

FIGS. 16A~16B show a bottom view of FIG. 15B.

For easy understanding the structure of FIG. 15B, FIG. 16A is copied from FIG. 15B FIG. 16A is a section view of FIG. 16B. FIG. 16B shows a partial area bottom view of FIG. 16A (FIG. 15B). A plurality of longitudinal dielectric ribs 273A and a plurality of latitudinal dielectric ribs 273B are formed in the bonding film 50 to strengthen the stiffness of the bonding film 50. A dielectric mesh 274 is formed by the longitudinal ribs 273A and the latitudinal ribs 273B with a plurality of mesh holes 275. Each of the large metal pads 282B is configured in a corresponding mesh hole 275.

Figure 17A:
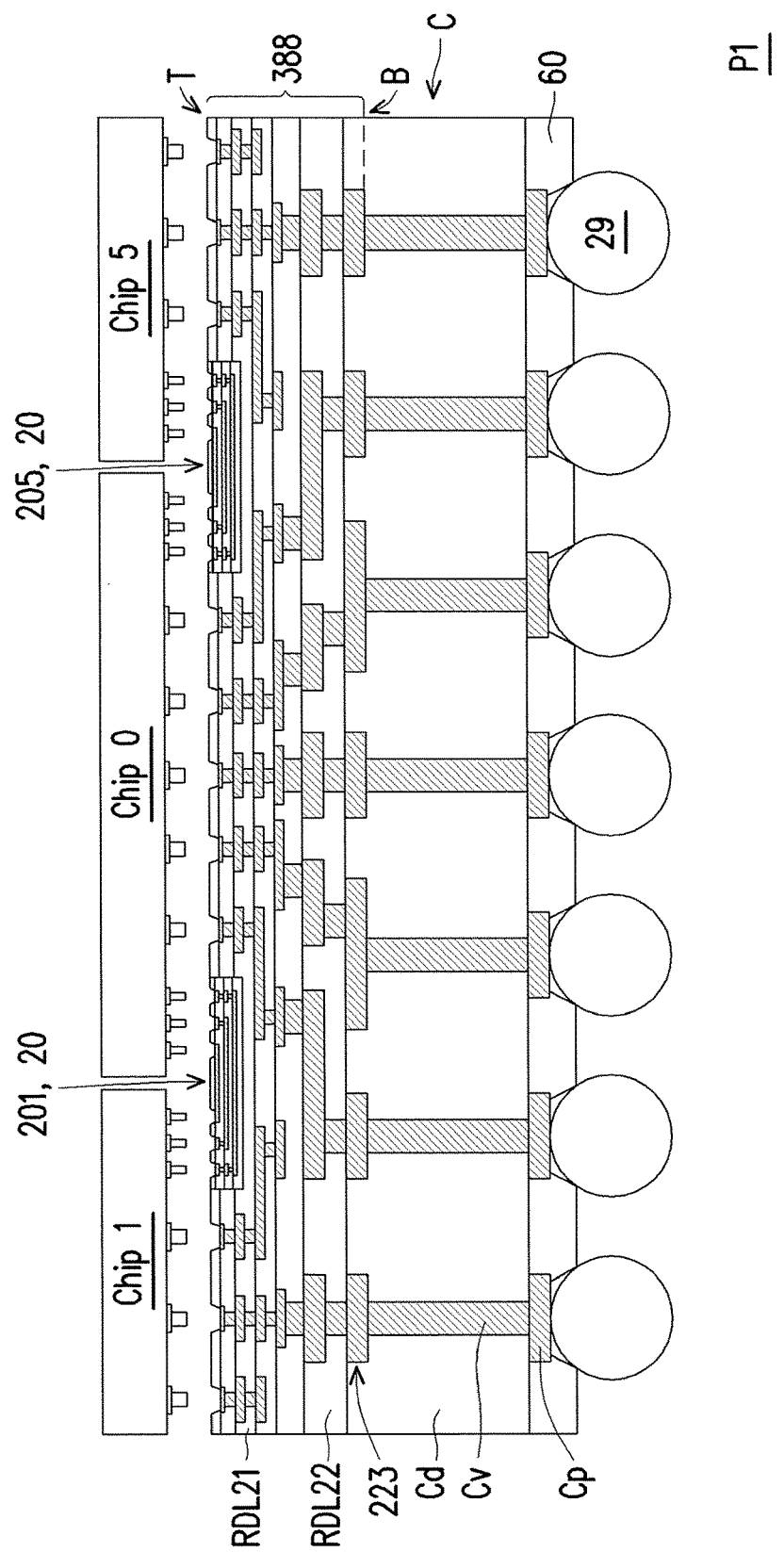
FIG. 17A shows a fifth embodiment according to the present invention.

FIG. 17A shows a fifth embodiment according to the present invention.

The present embodiment is similar with the embodiment illustrated in FIG. 7 and the difference therebetween lies in that a core C is disposed on the bottom redistribution layer RDL22 opposite to the top redistribution layer RDL 21. Referring to FIG. 17A, a package structure P1 includes the redistribution substrate 388, the bonding film (e.g. 201, 205) and a core C. For example, the redistribution substrate 388 has a top side T and a bottom side B opposite to the top side T. The bonding film 201, 205 is disposed at the top side T and embedded in the redistribution substrate 388. The top surface of the bonding film 201, 205 is coplanar with the top surface of the redistribution substrate 388. The top redistribution layer RDL 21 of the redistribution substrate 388 includes the top conductive pattern (e.g. metal via 211, circuitry 212 and bottom metal pads 213) The bottom redistribution layer RDL 22 of the redistribution substrate 388 includes the bottom conductive pattern (e.g. metal via 221, circuitry 222 and bottom metal pads 223) electrically coupled to the top conductive pattern, and a dimension of the top conductive pattern is less than a dimension of the bottom conductive pattern. For example, the line/space of the top conductive pattern is finer than the line/space of the bottom conductive pattern. It should be noted that the configuration of the bonding film and that of the redistribution substrate described in the aforementioned embodiments may be applied to the present embodiment, and the detailed descriptions are not repeated herein.

The core C is disposed at the bottom side B of the redistribution substrate 388 and electrically coupled to the redistribution substrate 388. The forming process of the bonding film 201, 205 and the redistribution substrate 388 in the present embodiment is similar with the aforementioned embodiments, and the detailed descriptions are omitted for brevity.

For example, the core C includes a core dielectric layer Cd, a core conductive pattern Cp and a through conductive via Cv (also known as a through hole). In some embodiments, a plurality of the through conductive vias Cv is embedded in the core dielectric layer Cd and electrically connected to the bottom conductive pattern (e.g. metal pads 223) of the redistribution substrate 388. The core conductive pattern Cp is disposed on the core dielectric layer Cd opposite to the redistribution substrate 388 and electrically connected to the through conductive vias Cv.

In some embodiments, the core C may be formed while the temporary carrier (e.g. temporary carrier I) is configured on the top side T of the redistribution substrate 388 for supporting. For example, the core dielectric layer Cd having a plurality of openings may be formed over the bottom redistribution layer RDL22 and the openings of the core dielectric layer Cd may expose the topmost metal pads 223. Next, the through conductive vias Cv may be formed in the openings of the core dielectric layer Cd to couple to the topmost metal pads 223. Subsequently, the core conductive pattern Cp may be formed on the core dielectric layer Cd to couple to the through conductive vias Cv. In some embodiments, the through conductive vias Cv may be formed before the core dielectric layer Cd. That is, there is no limitation in the present disclosure as to the forming sequence of the core dielectric layer Cd and the through conductive vias Cv. The core conductive pattern Cp may be formed on the core dielectric layer Cd to electrically connected to the through conductive vias Cv. In some embodiments, the core conductive pattern Cp and the through conductive vias Cv may be formed in the same process.

One property of a material to consider is the stiffness of the material, which can be expressed as Young's Modulus. In the present embodiment, the Young's modulus of the core C is greater than the Young's modulus of the redistribution substrate 388, thereby reinforcing the mechanical stability of the package substrate. In some embodiments, the core C may include materials such as pre-preg, ceramic, metal, or other suitable materials. The Young's modulus of the core dielectric layer Cd may be greater than the Young's modulus of the dielectric layer (e.g. D1, D2, D3 and D4) of the bonding film 201, 205 and may be also greater than the dielectric layer (e.g. 216) of the top redistribution layer RDL 21 and bottom redistribution layer RDL 22. In other words, the material of the core dielectric layer Cd is stiffer than the material of the dielectric layer of the bonding film 201, 205 and the redistribution substrate 388. In some embodiments, a thickness of the redistribution substrate 388 is less than a thickness of the core C. A thickness of the core C may be determined by the Young's modulus or stiffness of the core dielectric layer Cd, however the thickness of the core C is not limited thereto. For example, the core C with a higher stiffness may be thinner while still maintaining the stability of the structure. In other words, the core C with a higher Young's modulus than the dielectric layers in the interconnection structure is used to reinforce the mechanical stability of the package. Since the Young's modulus of the core C is greater than the Young's modulus of the redistribution substrate 388, the package structure P1 having a robust interconnection structure is achieved.

In some embodiments, the package structure P1 further includes a plurality of conductive terminals (e.g. solder balls 29). For example, the conductive terminals 29 disposed on the core conductive pattern Cp of the core C opposite to the redistribution substrate 388. The conductive terminals 29 are electrically connected to the core C. In some embodiment, the central chip 0 is disposed on the top side T of the redistribution substrate 388 and the peripheral chips (e.g. 1, 5) are disposed aside the central chip 0. FIG. 17A shows the chips are provided on the top side T of the redistribution substrate 388. It should be recognized that the chips are subsequently mounted on the redistribution substrate 388 and the bonding film 20 to form the package structure P1. The configuration of the chips may be similar to the aforementioned embodiments, and the detailed descriptions are omitted herein.

In some embodiments, a passivation layer 60 is disposed on the core C opposite to the redistribution substrate 388. The passivation layer 60 may have at least one opening exposing a portion of the core conductive pattern Cp. The portion of the core conductive pattern Cp may serve as the electrical contact pads for ball-mounting. For example, the passivation layer 60 may be a solder mask, or may include inorganic materials or other suitable insulating materials. In some other embodiments, a plurality of surface finishing layer (not illustrated) may be disposed in the openings of the passivation layer 60 and on portions of the core conductive pattern Cp exposed by the openings to inhibit oxidation and improve solderability.

Figure 17B:
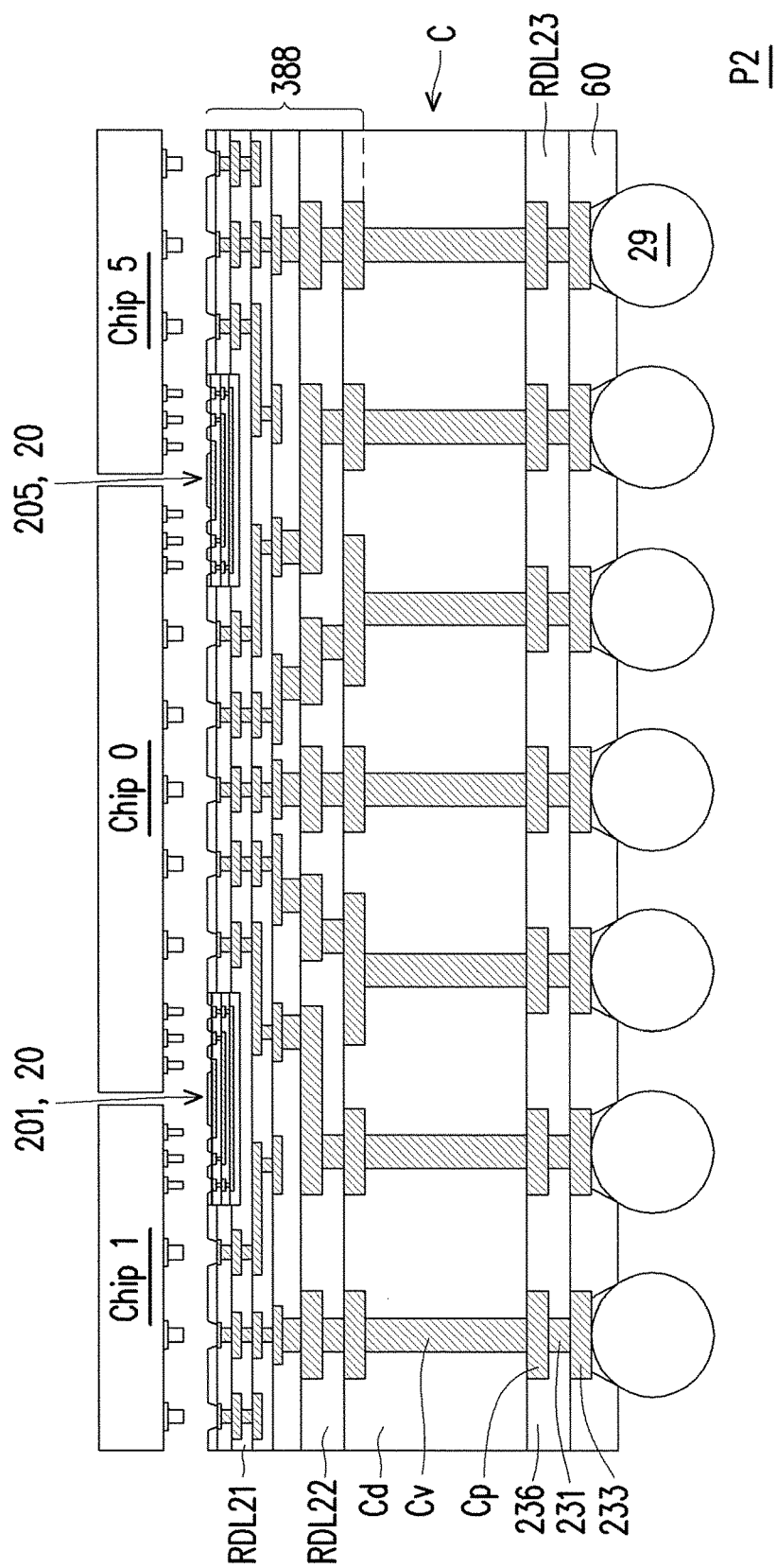
FIG. 17B shows a sixth embodiment according to the present invention.

FIG. 17B shows a sixth embodiment according to the present invention.

The present embodiment is similar with the embodiment illustrated in FIG. 17A and the difference therebetween lies in that a package structure P2 has an outer redistribution layer RDL 23 disposed between the core C and the conductive terminals (e.g. solder balls 29). Referring to FIG. 17B, for example, after forming the core C, the outer redistribution layer RDL 23 may be formed on the core C. For example, the outer redistribution layer RDL 23 may include a plurality of metal vias 231, a dielectric layer 236 and a plurality of metal pads 233. The metal vias 231 may be formed on the core conductive pattern Cp. The dielectric layer 236 may be formed on the core C to cover the core conductive pattern Cp and laterally encapsulate the metal vias 231. The metal pads 233 may be formed on the dielectric layer 236 and electrically coupled to the metal vias 231. In some embodiments, the metal vias 231 and the metal pads 233 may be formed in the same process. The Young's modulus of the core C is greater than a Young's modulus of the outer redistribution layer RDL 23.

After forming the outer redistribution layer RDL 23, the plurality of conductive terminals (e.g. solder balls 29) may be formed on the metal pads 233 to electrically couple to the outer redistribution layer RDL 23. In some embodiments, before forming the conductive terminals, the passivation layer 60 is disposed on the outer redistribution layer RDL 23 opposite to the core C. The passivation layer 60 may have at least one opening exposing a portion of the metal pads 233. The portion of the metal pads 233 may serve as the electrical contact pads for ball-mounting. In some other embodiments, a plurality of surface finishing layer (not illustrated) may be disposed in the openings of the passivation layer 60 and on portions of the metal pads 233 exposed by the openings to inhibit oxidation and improve solderability.

While several embodiments have been described by way of example, it will be apparent to those skilled in the art that various modifications may be configured without departs from the spirit of the present invention. Such modifications are all within the scope of the present invention, as defined by the appended claims.

Numerical system

| | |
|---|---|
| chip 0, 1, 2, 3 | solder ball 29 |
| bonding film 20, 30, 40, 50 | chip 301, 302, 303 |
| redistribution substrate 288 | chip 400, 401, 402 |

-continued

| | |
|---|---|
| bonding area 201, 202, 203, 204, 205 | dielectric layer D1, D2, D3, D4 |
| inner top metal pads 20R | metal circuitry M1, M2, M3 |
| outer top metal pads 20T | top redistribution layer RDL11, RDL21, RDL31 |
| metal via 211, 221, 231, 311 | bottom redistribution layer RDL12, RDL22, RDL32 |
| circuitry 212, 222 | outer redistribution layer RDL 23 |
| metal pad 213, 223, 233 | core C |
| dielectric layer 216, 236 | core dielectric layer Cd |
| bottom contact 23A | core conductive pattern Cp |
| metal contact 23B | through conductive via Cv |
| temporary carrier 25 | passivation layer 60 |
| openings 251 | package structure P1, P2 |
| central opening 252 | |
| left longitudinal branch 261 | |
| lower latitudinal branch 262 | |
| right longitudinal branch 263 | |
| upper latitudinal branch 264 | |
| underfill 271 | |
| molding compound 272 | |
| dielectric rib 273A, 273B | |
| dielectric mesh 274 | |
| mesh holes 275 | |
| bonding element 280, 281, 285 | |
| thick bonding element 280B | |
| central portion 282 | |
| large metal pad 282B | |
| substrate 288, 388, 488 | |

What is claimed is:

1. A package structure having an embedded bonding film, comprising:
    a redistribution substrate having a top side and a bottom side opposite to the top side;
    a bonding film disposed at the top side and embedded in the redistribution substrate, the bonding film comprising:
    at least one bonding area comprising an outer top metal pad and an inner top metal pad on a top surface of the bonding film within the at least one bonding area; and
    a metal circuit is disposed within the at least one bonding area, the metal circuit having an outer end electrically coupled to the outer top metal pad, and an inner end electrically coupled to the inner top metal pad; and
    a core disposed at the bottom side of the redistribution substrate and electrically coupled to the redistribution substrate, wherein a Young's modulus of the core is greater than a Young's modulus of the redistribution substrate.

2. The package structure having the embedded bonding film as claimed in claim 1, wherein a thickness of the redistribution substrate is less than a thickness of the core.

3. The package structure having the embedded bonding film as claimed in claim 1, wherein the core comprises:
    a core dielectric layer disposed at the bottom side of the redistribution substrate;
    a through conductive via embedded in the core dielectric layer and electrically coupled to the redistribution substrate; and
    a core conductive pattern disposed on the core dielectric layer opposite to the redistribution substrate and electrically coupled to the through conductive via.

4. The package structure having the embedded bonding film as claimed in claim 3, further comprising:
    a plurality of conductive terminals disposed on the core conductive pattern opposite to the redistribution substrate, wherein the conductive terminals are electrically connected to the core.

5. The package structure having the embedded bonding film as claimed in claim 1, further comprising:

an outer redistribution layer disposed on the core opposite to the redistribution substrate and electrically coupled to the core, wherein the Young's modulus of the core is greater than a Young's modulus of the outer redistribution layer.

6. The package structure having the embedded bonding film as claimed in claim 5, further comprising:
a plurality of conductive terminals disposed on the outer redistribution layer opposite to the core, wherein the conductive terminals are electrically connected to the outer redistribution layer.

7. The package structure having the embedded bonding film as claimed in claim 1, wherein the top surface of the bonding film s coplanar with a top surface of the redistribution substrate.

8. The package structure having the embedded bonding film as claimed in claim 1, wherein the redistribution substrate comprises:
a top redistribution layer is at the top side of the redistribution substrate, wherein the bonding film is embedded in the top redistribution layer; and
a bottom redistribution layer is at the bottom side of the redistribution substrate and connected between the top redistribution layer and the core.

9. The package structure having the embedded bonding film as claimed in claim 8, wherein the top redistribution layer comprises a top conductive pattern, the bottom redistribution layer comprises a bottom conductive pattern electrically coupled to the top conductive pattern, and a dimension of the top conductive pattern is less than a dimension of the bottom conductive pattern.

10. The package structure having the embedded bonding film as claimed in claim 1, further comprising:
a central chip disposed on the top side of the redistribution substrate, the central chip comprising a central bonding element disposed on a bottom surface of the central chip, the central bonding element of the central chip electrically coupled to the inner top metal pad within the at least one bonding area; and
a peripheral chip disposed aside the central chip, the peripheral chip comprising a peripheral bonding element disposed on a bottom surface of the peripheral chip, the peripheral bonding element of the peripheral chip electrically coupled to the outer top metal pad within the at least one bonding area, wherein the central chip communicates with the peripheral chip through the inner top metal pad, the metal circuit and the outer top metal pad of the bonding film.

11. The package structure having the embedded bonding film as claimed in claim 10, wherein the central chip comprises a central thick bonding element disposed aside the central bonding element, the central thick bonding element is thicker than the central bonding element, the peripheral chip comprises a peripheral thick bonding element disposed aside the peripheral bonding element, the peripheral thick bonding element is thicker than the peripheral bonding element.

12. The package structure having the embedded bonding film as claimed in claim 11, wherein the redistribution substrate comprises:
a plurality of large metal pads disposed at the top side and surrounding the bonding film, wherein the central thick bonding element and the peripheral thick bonding element are electrically coupled to the large metal pads, respectively, and each of the large metal pads has a surface area at least two times larger than that of the outer top metal pad and the inner top metal pad.

13. The package structure having the embedded bonding film as claimed in claim 1, wherein the bonding film comprises:
a left longitudinal branch and a lower latitudinal branch, a lower end of the left longitudinal branch connected to a left end of the lower latitudinal branch, the at least one bonding area located on the left longitudinal branch and the lower latitudinal branch, the left longitudinal branch and the lower latitudinal branch forming an L shape, the at least one bonding area is on the left longitudinal branch and the lower latitudinal branch.

14. The package structure having the embedded bonding film as claimed in claim 13, wherein the bonding film further comprises:
a right longitudinal branch having a lower end connected to a right end of the lower latitudinal branch, wherein the left and right longitudinal branches and the lower latitudinal branch form a U shape, and the at least one bonding area is on the right longitudinal branch.

* * * * *